United States Patent
Karczewicz

(10) Patent No.: US 6,879,268 B2
(45) Date of Patent: Apr. 12, 2005

(54) ADAPTIVE VARIABLE LENGTH CODING OF DIGITAL VIDEO

(75) Inventor: Marta Karczewicz, Irving, TX (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/629,085

(22) Filed: Jul. 29, 2003

(65) Prior Publication Data

US 2004/0021592 A1 Feb. 5, 2004

Related U.S. Application Data

(63) Continuation of application No. 10/054,610, filed on Jan. 22, 2002, now Pat. No. 6,690,307.

(51) Int. Cl.[7] .................................................. H03M 7/40
(52) U.S. Cl. .......................................... 341/67; 341/65
(58) Field of Search .............................. 341/67, 65, 50, 341/106, 107

(56) References Cited

U.S. PATENT DOCUMENTS

| 5,668,547 A | | 9/1997 | Lee .............................. 341/63 |
| 5,754,696 A | * | 5/1998 | Miyashita et al. .......... 382/232 |
| RE37,507 E | | 1/2002 | Jung ............................. 341/63 |
| 6,412,112 B1 | | 6/2002 | Barrett et al. ................ 725/152 |

OTHER PUBLICATIONS

ITU–Telecommunications Standardization Sector, Doc. VCEG, "H.26L Test Model Long Term No. 8 (TML–8) draft 0", Section 2.3 G. Bjontegaard, 2001.
"Image and Video Compression Standards", Bhaskaran et al., ISBN 0–7923–9952–8, Section 2.9, 1997.
"Information Technology—Digital Compression and Coding of Continuous–Tone Still Images—Requirements and Guidelines", ITU–T Recommendation T.81, 1992.

* cited by examiner

Primary Examiner—Peguy JeanPierre
(74) Attorney, Agent, or Firm—Perman & Green, LLP

(57) ABSTRACT

The invention relates to a method of adaptive variable length coding in which a set of data symbols comprising a certain first number of data symbols having a first value and a certain second number of data symbols having values other than the first value are represented by variable length codewords. According to the invention, at least one characteristic of the variable length coding applied to the data symbols is adapted according to the second number of data symbols which have values other than the first value. The invention also relates to a corresponding method of variable length decoding, as well as an encoder and decoder which implement the variable length coding and decoding methods according to the invention.

43 Claims, 8 Drawing Sheets

|  0 |  1 | 0 | -1 |
|----|----|---|----|
|  2 |  0 | 0 |  0 |
|  0 |  0 | 0 |  0 |
|  0 |  0 | 0 |  0 |

Figure 5

ADAPTIVE VARIABLE LENGTH CODING OF DIGITAL VIDEO

CROSS-REFERENCE TO RELATED APPLICATIONS

This application is a continuation of and claims priority from U.S. patent application Ser. No. 10/054,610 filed on Jan. 22, 2002, which is now a U.S. Pat. No. 6,690,307.

FIELD OF THE INVENTION COPY

The invention concerns the variable length coding of data symbols. More specifically, the invention relates to a method of variable length coding suitable for application in the coding of digital video.

BACKGROUND OF THE INVENTION

Digital video sequences, like ordinary motion pictures recorded on film, comprise a sequence of still images, the illusion of motion being created by displaying the images one after the other at a relatively fast rate, typically 15 to 30 frames per second. Because of the relatively fast display rate, images in consecutive frames tend to be quite similar and thus contain a considerable amount of redundant information. For example, a typical scene may comprise some stationary elements, such as background scenery, and some moving areas, which may take many different forms, for example the face of a newsreader, moving traffic and so on. Alternatively, the camera recording the scene may itself be moving, in which case all elements of the image have the same kind of motion. In many cases, this means that the overall change between one video frame and the next is rather small.

Each frame of an uncompressed digital video sequence comprises an array of image pixels. For example, in a commonly used digital video format, known as the Quarter Common Interchange Format (QCIF), a frame comprises an array of 176×144 pixels, in which case each frame has 25,344 pixels. In turn, each pixel is represented by a certain number of bits which carry information about the luminance and/or colour content of the region of the image corresponding to the pixel. Commonly, a so-called YUV colour model is used to represent the luminance and chrominanc content of the image. The luminance, or Y, component represents the intensity (brightness) of the image, while the colour content of the image is represented by two chrominance or colour difference components, labelled U and V.

Colour models based on a luminance/chrominance representation of image content provide certain advantages compared with colour models that are based on a representation involving primary colours (that is Red, Green and Blue, RGB). The human visual system is more sensitive to intensity variations than it is to colour variations and YUV colour models exploit this property by using a lower spatial resolution for the chrominance components (U, V) than for the luminance component (Y). In this way, the amount of information needed to code the colour information in an image can be reduced with an acceptable reduction in image quality.

The lower spatial resolution of the chrominance components is usually attained by sub-sampling. Typically, each frame of a video sequence is divided into so-called 'macroblocks', which comprise luminance (Y) information and associated chrominance (U, V) information which is spatially sub-sampled. FIG. 3 illustrates one way in which macroblocks can be formed. FIG. 3a shows a frame of a video sequence represented using a YUV colour model, each component having the same spatial resolution. Macroblocks are formed by representing a region of 16×16 image pixels in the original image (FIG. 3b) as four blocks of luminance information, each luminance block comprising an 8×8 array of luminance (Y) values and two spatially corresponding chrominance components (U and V) which are sub-sampled by a factor of two in the x and y directions to yield corresponding arrays of 8×8 chrominance (U, V) values (see FIG. 3c). According to certain video coding recommendations, such as International Telecommunications Union (ITU-T) recommendation H.26L, the fundamental block size used within the macroblocks can be other than 8×8, for example 4×8 or 4×4. (See G. Bjontegaard, "H.26L Test Model Long Term Number 8 (TML-8) draft 0", VCEG-N1O, June 2001, section 2.3).

A QCIF image comprises 11×9 macroblocks. If the luminance blocks and chrominance blocks are represented with 8 bit resolution (that is by numbers in the range 0 to 255), the total number of bits required per macroblock is (16×16×8)+2×(8×8×8)=3072 bits. The number of bits needed to represent a video frame in QCIF format is thus 99×3072=304,128 bits. This means that the amount of data required to transmit/record/display an uncompressed video sequence in QCIF format, represented using a YUV colour model, at a rate of 30 frames per second, is more than 9 Mbps (million bits per second). This is an extremely high data rate and is impractical for use in video recording, transmission and display applications because of the very large storage capacity, transmission channel capacity and hardware performance required.

If video data is to be transmitted in real-time over a fixed line network such as an ISDN (Integrated Services Digital Network) or a conventional PSTN (Public Switched Telephone Network), the available data transmission bandwidth is typically of the order of 64 kbits/s. In mobile videotelephony, where transmission takes place at least in part over a radio communications link, the available bandwidth can be as low as 20 kbits/s. This means that a significant reduction in the amount of information used to represent video data must be achieved in order to enable transmission of digital video sequences over low bandwidth communication networks. For this reason, video compression techniques have been developed which reduce the amount of information transmitted while retaining an acceptable image quality.

Video compression methods are based on reducing the redundant and perceptually irrelevant parts of video sequences. The redundancy in video sequences can be categorised into spatial, temporal and spectral redundancy. 'Spatial redundancy' is the term used to describe the correlation (similarity) between neighbouring pixels within a frame. The term 'temporal redundancy' expresses the fact that objects appearing in one frame of a sequence are likely to appear in subsequent frames, while 'spectral redundancy' refers to the correlation between different colour components of the same image.

Sufficiently efficient compression cannot usually be achieved by simply reducing the various forms of redundancy in a given sequence of images. Thus, most current video encoders also reduce the quality of those parts of the video sequence which are subjectively the least important. In addition, the redundancy of the compressed video bitstream itself is reduced by means of efficient loss-less encoding. Generally, this is achieved using a technique known as entropy coding.

There is often a significant amount of spatial redundancy between the pixels that make up each frame of a digital video sequence. In other words, the value of any pixel within a frame of the sequence is substantially the same as the value of other pixels in its immediate vicinity. Typically, video coding systems reduce spatial redundancy using a technique known as 'block-based transform coding', in which a mathematical transformation is applied to the pixels of an image, on a macroblock-by-macroblock basis. Transform coding translates the image data from a representation comprising pixel values to a form comprising a set of coefficient values, each of which is a weighting factor (multiplier) for a basis function of the transform in question. By using certain mathematical transformations, such as the two-dimensional Discrete Cosine Transform (DCT), the spatial redundancy within a frame of a digital video sequence can be significantly reduced, thereby producing a more compact representation of the image data.

Frames of a video sequence which are compressed using block-based transform coding, without reference to any other frame within the sequence, are referred to as INTRA-coded or I-frames. Additionally, and where possible, blocks of INTRA-coded frames are predicted from previously coded blocks within the same frame. This technique, known as INTRA-prediction, has the effect of further reducing the amount of data required to represent an INTRA-coded frame.

Generally, video coding systems not only reduce the spatial redundancy within individual frames of a video sequence, but also make use of a technique known as 'motion-compensated prediction', to reduce the temporal redundancy in the sequence. Using motion-compensated prediction, the image content of some (often many) frames in a digital video sequence is 'predicted' from one or more other frames in the sequence, known as 'reference' or 'anchor' frames. Prediction of image content is achieved by tracking the motion of objects or regions of an image between a frame to be coded (compressed) and the reference frame(s) using 'motion vectors'. In general, the reference frame(s) may precede the frame to be coded or may follow it in the video sequence. As in the case of INTRA-coding, motion compensated prediction of a video frame is typically performed macroblock-by-macroblock.

Frames of a video sequence which are compressed using motion-compensated prediction are generally referred to as INTER-coded or P-frames. Motion-compensated prediction alone rarely provides a sufficiently precise representation of the image content of a video frame and therefore it is typically necessary to provide a so-called 'prediction error' (PE) frame with each INTER-coded frame. The prediction error frame represents the difference between a decoded version of the INTER-coded frame and the image content of the frame to be coded. More specifically, the prediction error frame comprises values that represent the difference between pixel values in the frame to be coded and corresponding reconstructed pixel values formed on the basis of a predicted version of the frame in question. Consequently, the prediction error frame has characteristics similar to a still image and block-based transform coding can be applied in order to reduce its spatial redundancy and hence the amount of data (number of bits) required to represent it.

In order to illustrate the operation of a video coding system in greater detail, reference will now be made to FIGS. 1 and 2. FIG. 1 is a schematic diagram of a generic video encoder that employs a combination of INTRA- and INTER-coding to produce a compressed (encoded) video bit-stream. A corresponding decoder is illustrated in FIG. 2 and will be described later in the text.

The video encoder 100 comprises an input 101 for receiving a digital video signal from a camera or other video source (not shown). It also comprises a transformation unit 104 which is arranged to perform a block-based discrete cosine transform (DCT), a quantiser 106, an inverse quantiser 108, an inverse transformation unit 110, arranged to perform an inverse block-based discrete cosine transform (IDCT), combiners 112 and 116, and a frame store 120. The encoder further comprises a motion estimator 130, a motion field coder 140 and a motion compensated predictor 150. Switches 102 and 114 are operated co-operatively by control manager 160 to switch the encoder between an INTRA-mode of video encoding and an INTER-mode of video encoding. The encoder 100 also comprises a video multiplex coder 170 which forms a single bit-stream from the various types of information produced by the encoder 100 for further transmission to a remote receiving terminal or, for example, for storage on a mass storage medium, such as a computer hard drive (not shown).

Encoder 100 operates as follows. Each frame of uncompressed video provided from the video source to input 101 is received and processed macroblock by macroblock, preferably in raster-scan order. When the encoding of a new video sequence starts, the first frame to be encoded is encoded as an INTRA-coded frame. Subsequently, the encoder is programmed to code each frame in INTER-coded format, unless one of the following conditions is met: 1) it is judged that the current macroblock of the frame being coded is so dissimilar from the pixel values in the reference frame used in its prediction that excessive prediction error information is produced, in which case the current macroblock is coded in INTRA-coded format; 2) a predefined INTRA frame repetition interval has expired; or 3) feedback is received from a receiving terminal indicating a request for a frame to be provided in INTRA-coded format.

The occurrence of condition 1) is detected by monitoring the output of the combiner 116. The combiner 116 forms a difference between the current macroblock of the frame being coded and its prediction, produced in the motion compensated prediction block 150. If a measure of this difference (for example a sum of absolute differences of pixel values) exceeds a predetermined threshold, the combiner 116 informs the control manager 160 via a control line 119 and the control manager 160 operates the switches 102 and 114 via control line 113 so as to switch the encoder 100 into INTRA-coding mode. In this way, a frame which is otherwise encoded in INTER-coded format may comprise INTRA-coded macroblocks. Occurrence of condition 2) is monitored by means of a timer or frame counter implemented in the control manager 160, in such a way that if the timer expires, or the frame counter reaches a predetermined number of frames, the control manager 160 operates the switches 102 and 114 via control line 113 to switch the encoder into INTRA-coding mode. Condition 3) is triggered if the control manager 160 receives a feedback signal from, for example, a receiving terminal, via control line 121 indicating that an INTRA frame refresh is required by the receiving terminal. Such a condition may arise, for example, if a previously transmitted frame is badly corrupted by interference during its transmission, rendering it impossible to decode at the receiver. In this situation, the receiving decoder issues a request for the next frame to be encoded in INTRA-coded format, thus re-initialising the coding sequence.

Operation of the encoder 100 in INTRA-coding mode will now be described. In INTRA-coding mode, the control manager 160 operates the switch 102 to accept video input from input line 118. The video signal input is received macroblock by macroblock from input 101 via the input line 118. As they are received, the blocks of luminance and chrominance values which make up the macroblock are passed to the DCT transformation block 104, which performs a 2-dimensional discrete cosine transform on each block of values, producing a 2-dimensional array of DCT coefficients for each block. DCT transformation block 104 produces an array of coefficient values for each block, the number of coefficient values depending on the nature of the blocks which make up the macroblock. For example, if the fundamental block size used in the macroblock is 4×4, DCT transformation block 104 produces a 4×4 array of DCT coefficients for each block. If the block size is 8×8, an 8×8 array of DCT coefficients is produced.

The DCT coefficients for each block are passed to the quantiser 106, where they are quantised using a quantisation parameter QP. Selection of the quantisation parameter QP is controlled by the control manager 160 via control line 115. Quantisation introduces a loss of information, as the quantised coefficients have a lower numerical precision than the coefficients originally generated by the DCT transformation block 104. This provides a further mechanism by which the amount of data required to represent each image of the video sequence can be reduced. However, unlike the DCT transformation, which is essentially lossless, the loss of information introduced by quantisation causes an irreversible degradation in image quality. The greater the degree of quantisation applied to the DCT coefficients, the greater the loss of image quality.

The quantised DCT coefficients for each block are passed from the quantiser 106 to the video multiplex coder 170, as indicated by line 125 in FIG. 1. The video multiplex coder 170 orders the quantised transform coefficients for each block using a zigzag scanning procedure. This operation converts the two-dimensional array of quantised transform coefficients into a one-dimensional array. Typical zigzag scanning orders, such as that for a 4×4 array shown in FIG. 4, order the coefficients approximately in ascending order of spatial frequency. This also tends to order the coefficients according to their values, such that coefficients positioned earlier in the one-dimensional array are more likely to have larger absolute values than coefficients positioned later in the array. This is because lower spatial frequencies tend to have higher amplitudes within the image blocks. Consequently, values occurring towards the end of the one-dimensional array of quantised transform coefficients tend to be zeros.

Typically, the video multiplex coder 170 represents each non-zero quantised coefficient in the one dimensional array by two values, referred to as level and run. Level is the value of the quantised coefficient and run is the number of consecutive zero-valued coefficients preceding the coefficient in question. The run and level values for a given coefficient are ordered such that the level value precedes the associated run value. A level value equal to zero is used to indicate that there are no more non-zero coefficient values in the block. This 0-level value is referred to as an EOB (end-of-block) symbol.

The run and level values are further compressed in the video multiplex coder 170 using entropy coding. Entropy coding is a lossless operation, which exploits the fact that symbols within a data set to be coded generally have different probabilities of occurrence. Since certain values of levels and runs are more likely to occur than others, entropy coding techniques can be used effectively to reduce the number of bits required to code the run and level values which represent the quantised transform coefficients. A number of different methods can be used to implement entropy coding. One method commonly used in video coding systems is known as Variable Length Coding (VLC). Generally, the VLC codewords are sequences of bits (i.e. 0's and 1's) constructed so that the length of a given codeword corresponds to the frequency of occurrence of the symbol it represents. Thus, instead of using a fixed number of bits to represent each symbol to be coded, a variable number of bits is assigned such that symbols which are more likely to occur are represented with VLC codewords having fewer bits. As the lengths of the codewords may be (and generally are) different, they must also be constructed in such as to be uniquely decodable. In other words, if a valid sequence of bits having a certain finite length is received by a decoder, there should be only one possible input sequence of symbols corresponding to the received sequence of bits. In the video encoder shown in FIG. 1, entropy coding of the run and level parameters using variable length coding may be implemented by means of look-up tables which define the mapping between each possible symbol in the data set to be coded and its corresponding variable length code. Such look-up tables are often defined by statistical analysis of training material comprising symbols identical to those to be coded and having similar statistical properties.

An alternative method of entropy coding, known as arithmetic coding, can also be used to convert the run and level values into variable length codewords. In arithmetic coding a group of symbols, for example the run and level values for a block of quantised transform coefficients, are coded as a single floating point decimal number. This approach to entropy coding, in which a group of symbols is encoded using a single codeword, can lead to improved compression efficiency compared with methods such as variable length coding which represent each symbol independently. Further details concerning arithmetic coding can be found from Vasudev Bhaskaran and Konstantinos Konstantinides "Image and Video Compression Standards" $2^{nd}$ Edition, Kluwer Academic Publishers, 1999, ISBN 0-7923-9952-8, Section 2.9, for example.

Once the run and level values have been entropy coded using an appropriate method, the video multiplex coder 170 further combines them with control information, also entropy coded using a variable length coding method appropriate for the kind of information in question, to form a single compressed bit-stream of coded image information 135. While entropy coding has been described in connection with operations performed by the video multiplex coder 170, it should be noted that in alternative implementations a separate entropy coding unit may be provided.

A locally decoded version of the macroblock is also formed in the encoder 100. This is done by passing the quantised transform coefficients for each block, output by quantiser 106, through inverse quantiser 108 and applying an inverse DCT transform in inverse transformation block 110. In this way a reconstructed array of pixel values is constructed for each block of the macroblock. The resulting decoded image data is input to combiner 112. In INTRA-coding mode, switch 114 is set so that the input to the combiner 112 via switch 114 is zero. In this way, the operation performed by combiner 112 is equivalent to passing the decoded image data unaltered.

As subsequent macroblocks of the current frame are received and undergo the previously described encoding and local decoding steps in blocks 104, 106, 108, 110 and 112, a decoded version of the INTRA-coded frame is built up in frame store 120. When the last macroblock of the current frame has been INTRA-coded and subsequently decoded, the frame store 120 contains a completely decoded frame, available for use as a prediction reference frame in coding a subsequently received video frame in INTER-coded format.

Operation of the encoder 100 in INTER-coding mode will now be described. In INTER-coding mode, the control manager 160 operates switch 102 to receive its input from line 117, which comprises the output of combiner 116. The combiner 116 receives the video input signal macroblock by macroblock from input 101. As combiner 116 receives the blocks of luminance and chrominance values which make up the macroblock, it forms corresponding blocks of prediction error information. The prediction error information represents the difference between the block in question and its prediction, produced in motion compensated prediction block 150. More specifically, the prediction error information for each block of the macroblock comprises a two-dimensional array of values, each of which represents the difference between a pixel value in the block of luminance or chrominance information being coded and a decoded pixel value obtained by forming a motion-compensated prediction for the block, according to the procedure described below. Thus, in a situation where each macroblock comprises, for example, an assembly of 4×4 blocks comprising luminance and chrominance values the prediction error information for each block of the macroblock similarly comprises a 4×4 array of prediction error values.

The prediction error information for each block of the macroblock is passed to DCT transformation block 104, which performs a two-dimensional discrete cosine transform on each block of prediction error values to produce a two-dimensional array of DCT transform coefficients for each block. DCT transformation block 104 produces an array of coefficient values for each prediction error block, the number of coefficient values depending on the nature of the blocks which make up the macroblock. For example, if the fundamental block size used in the macroblock is 4×4, DCT transformation block 104 produces a 4×4 array of DCT coefficients for each prediction error block. If the block size is 8×8, an 8×8 array of DCT coefficients is produced.

The transform coefficients for each prediction error block are passed to quantiser 106 where they are quantised using a quantisation parameter QP, in a manner analogous to that described above in connection with operation of the encoder in INTRA-coding mode. Again, selection of the quantisation parameter QP is controlled by the control manager 160 via control line 115.

The quantised DCT coefficients representing the prediction error information for each block of the macroblock are passed from quantiser 106 to video multiplex coder 170, as indicated by line 125 in FIG. 1. As in INTRA-coding mode, the video multiplex coder 170 orders the transform coefficients for each prediction error block using the previously described zigzag scanning procedure (see FIG. 4) and then represents each non-zero quantised coefficient as a level and a run value. It further compresses the run and level values using entropy coding, in a manner analogous to that described above in connection with INTRA-coding mode. Video multiplex coder 170 also receives motion vector information (described in the following) from motion field coding block 140 via line 126 and control information from control manager 160. It entropy codes the motion vector information and control information and forms a single bit-stream of coded image information, 135 comprising the entropy coded motion vector, prediction error and control information.

The quantised DCT coefficients representing the prediction error information for each block of the macroblock are also passed from quantiser 106 to inverse quantiser 108. Here they are inverse quantised and the resulting blocks of inverse quantised DCT coefficients are applied to inverse DCT transform block 110, where they undergo inverse DCT transformation to produce locally decoded blocks of prediction error values. The locally decoded blocks of prediction error values are then input to combiner 112. In INTER-coding mode, switch 114 is set so that the combiner 112 also receives predicted pixel values for each block of the macroblock, generated by motion-compensated prediction block 150. The combiner 112 combines each of the locally decoded blocks of prediction error values with a corresponding block of predicted pixel values to produce reconstructed image blocks and stores them in frame store 120.

As subsequent macroblocks of the video signal are received from the video source and undergo the previously described encoding and decoding steps in blocks 104, 106, 108, 110, 112, a decoded version of the frame is built up in frame store 120. When the last macroblock of the frame has been processed, the frame store 120 contains a completely decoded frame, available for use as a prediction reference frame in encoding a subsequently received video frame in INTER-coded format.

Formation of a prediction for a macroblock of the current frame will now be described. Any frame encoded in INTER-coded format requires a reference frame for motion-compensated prediction. This means, necessarily, that when encoding a video sequence, the first frame to be encoded, whether it is the first frame in the sequence, or some other frame, must be encoded in INTRA-coded format. This, in turn, means that when the video encoder 100 is switched into INTER-coding mode by control manager 160, a complete reference frame, formed by locally decoding a previously encoded frame, is already available in the frame store 120 of the encoder. In general, the reference frame is formed by locally decoding either an INTRA-coded frame or an INTER-coded frame.

The first step in forming a prediction for a macroblock of the current frame is performed by motion estimation block 130. The motion estimation block 130 receives the blocks of luminance and chrominance values which make up the current macroblock of the frame to be coded via line 128. It then performs a block matching operation in order to identify a region in the reference frame which corresponds substantially with the current macroblock. In order to perform the block matching operation, motion estimation block accesses reference frame data stored in frame store 120 via line 127. More specifically, motion estimation block 130 performs block-matching by calculating difference values (e.g. sums of absolute differences) representing the difference in pixel values between the macroblock under examination and candidate best-matching regions of pixels from a reference frame stored in the frame store 120. A difference value is produced for candidate regions at all possible offsets within a predefined search region of the reference frame and motion estimation block 130 determines the smallest calculated difference value. The offset between the macroblock in the current frame and the candidate block of pixel values in the reference frame that yields the smallest difference value defines the motion vector for the macroblock in question.

Once the motion estimation block 130 has produced a motion vector for the macroblock, it outputs the motion vector to the motion field coding block 140. The motion field coding block 140 approximates the motion vector received from motion estimation block 130 using a motion model comprising a set of basis functions and motion coefficients. More specifically, the motion field coding block 140 represents the motion vector as a set of motion coefficient values which, when multiplied by the basis functions, form an approximation of the motion vector. Typically, a translational motion model having only two motion coefficients and basis functions is used, but motion models of greater complexity may also be used.

The motion coefficients are passed from motion field coding block 140 to motion compensated prediction block 150. Motion compensated prediction block 150 also receives the best-matching candidate region of pixel values identified by motion estimation block 130 from frame store 120. Using the approximate representation of the motion vector generated by motion field coding block 140 and the pixel values of the best-matching candidate region of pixels from the reference frame, motion compensated prediction block 150 generates an array of predicted pixel values for each block of the macroblock. Each block of predicted pixel values is passed to combiner 116 where the predicted pixel values are subtracted from the actual (input) pixel values in the corresponding block of the current macroblock. In this way a set of prediction error blocks for the macroblock is obtained.

Operation of the video decoder 200, shown in FIG. 2 will now be described. The decoder 200 comprises a video multiplex decoder 270, which receives an encoded video bit-stream 135 from the encoder 100 and demultiplexes it into its constituent parts, an inverse quantiser 210, an inverse DCT transformer 220, a motion compensated prediction block 240, a frame store 250, a combiner 230, a control manager 260, and an output 280.

The control manager 260 controls the operation of the decoder 200 in response to whether an INTRA- or an INTER-coded frame is being decoded. An INTRA/INTER trigger control signal, which causes the decoder to switch between decoding modes is derived, for example, from picture type information provided in a header portion of each compressed video frame received from the encoder. The INTRA/INTER trigger control signal is extracted from the encoded video bit-stream by the video multiplex decoder 270 and is passed to control manager 260 via control line 215.

Decoding of an INTRA-coded frame is performed on a macroblock-by-macroblock basis, each macroblock being decoded substantially as soon as encoded information relating to it is received in the video bit-stream 135. The video multiplex decoder 270 separates the encoded information for the blocks of the macroblock from possible control information relating to the macroblock in question. The encoded information for each block of an INTRA-coded macroblock comprises variable length codewords representing the entropy coded level and run values for the non-zero quantised DCT coefficients of the block. The video multiplex decoder 270 decodes the variable length codewords using a variable length decoding method corresponding to the encoding method used in the encoder 100 and thereby recovers the level and run values. It then reconstructs the array of quantised transform coefficient values for each block of the macroblock and passes them to inverse quantiser 210. Any control information relating to the macroblock is also decoded in the video multiplex decoder using an appropriate decoding method and is passed to control manager 260. In particular, information relating to the level of quantisation applied to the transform coefficients is extracted from the encoded bit-stream by video multiplex decoder 270 and provided to control manager 260 via control line 217. The control manager, in turn, conveys this information to inverse quantiser 210 via control line 218. Inverse quantiser 210 inverse quantises the quantised DCT coefficients for each block of the macroblock according to the control information and provides the now inverse quantised DCT coefficients to inverse DCT transformer 220.

Inverse DCT transformer 220 performs an inverse DCT transform on the inverse quantised DCT coefficients for each block of the macroblock to form a decoded block of image information comprising reconstructed pixel values. As motion-compensated prediction is not used in the encoding/decoding of INTRA-coded macroblocks, control manager 260 controls combiner 230 in such a way as to prevent any reference information being used in the decoding of the INTRA-coded macroblock. The reconstructed pixel values for each block of the macroblock are passed to the video output 280 of the decoder where, for example, they can be provided to a display device (not shown). The reconstructed pixel values for each block of the macroblock are also stored in frame store 250. As subsequent macroblocks of the INTRA-coded frame are decoded and stored, a decoded frame is progressively assembled in the frame store 250 and thus becomes available for use as a reference frame for motion compensated prediction in connection with the decoding of subsequently received INTER-coded frames.

INTER-coded frames are also decoded macroblock by macroblock, each INTER-coded macroblock being decoded substantially as soon as encoded information relating to it is received in the bit-stream 135. The video multiplex decoder 270 separates the encoded prediction error information for each block of an INTER-coded macroblock from encoded motion vector information and possible control information relating to the macroblock in question. As explained in the foregoing, the encoded prediction error information for each block of the macroblock comprises variable length codewords representing the entropy coded level and run values for the nonzero quantised transform coefficients of the prediction error block in question. The video multiplex decoder 270 decodes the variable length codewords using a variable length decoding method corresponding to the encoding method used in the encoder 100 and thereby recovers the level and run values. It then reconstructs an array of quantised transform coefficient values for each prediction error block and passes them to inverse quantiser 210. Control information relating to the INTER-coded macroblock is also decoded in the video multiplex decoder 270 using an appropriate decoding method and is passed to control manager 260. Information relating to the level of quantisation applied to the transform coefficients of the prediction error blocks is extracted from the encoded bit-stream and provided to control manager 260 via control line 217. The control manager, in turn, conveys this information to inverse quantiser 210 via control line 218. Inverse quantiser 210 inverse quantises the quantised DCT coefficients representing the prediction error information for each block of the macroblock according to the control information and provides the now inverse quantised DCT coefficients to inverse DCT transformer 220. The inverse quantised DCT coefficients representing the prediction error information for each block are then inverse transformed in the inverse DCT transformer 220 to yield an array of reconstructed prediction error values for each block of the macroblock.

The encoded motion vector information associated with the macroblock is extracted from the encoded video bit-stream 135 by video multiplex decoder 270 and is decoded. The decoded motion vector information thus obtained is passed to motion compensated prediction block 240, which reconstructs a motion vector for the macroblock using the same motion model as that used to encode the INTER-coded macroblock in encoder 100. The reconstructed motion vector approximates the motion vector originally determined by motion estimation block 130 of the encoder. The motion compensated prediction block 240 of the decoder uses the reconstructed motion vector to identify the location of a region of reconstructed pixels in a prediction reference frame stored in frame store 250. The reference frame may be, for example, a previously decoded INTRA-coded frame, or a previously decoded INTER-coded frame. In either case, the region of pixels indicated by the reconstructed motion vector is used to form a prediction for the macroblock in question. More specifically, the motion compensated prediction block 240 forms an array of pixel values for each block of the macroblock by copying corresponding pixel values from the region of pixels identified in the reference frame. The prediction, that is the blocks of pixel values derived from the reference frame, are passed from motion compensated prediction block 240 to combiner 230 where they are combined with the decoded prediction error information. In practice, the pixel values of each predicted block are added to corresponding reconstructed prediction error values output by inverse DCT transformer 220. In this way an array of reconstructed pixel values for each block of the macroblock is obtained. The reconstructed pixel values are passed to the video output 280 of the decoder and are also stored in frame store 250. As subsequent macroblocks of the INTER-coded frame are decoded and stored, a decoded frame is progressively assembled in the frame store 250 and thus becomes available for use as a reference frame for motion-compensated prediction of other INTER-coded frames.

Entropy coding of the run and level values associated with the quantised transform coefficients using the technique of variable length coding (VLC) will now be examined in greater detail by means of an example. As explained in the foregoing, the two-dimensional array of quantised transform coefficients produced by transform coding and quantising a block of luminance/chrominance data (INTRA-coding mode) or prediction error data (INTER-coding mode) is first scanned using a zigzag scanning scheme to form an ordered one-dimensional array. A typical scanning order for a 4×4 array of coefficient values is illustrated in FIG. 4. It will be apparent to those skilled in the art that variations in the exact nature of the zigzag scanning order are possible. Furthermore, similar zigzag scanning schemes may also be applied to arrays of other than 4×4 coefficient values.

The ordered one-dimensional array produced as a result of the zigzag scanning operation is then examined and each non-zero coefficient is represented by a run value and a level value. As previously explained, the run value represents the number of consecutive zero coefficients preceding the coefficient in question. It thus provides an indication of the position of the non-zero coefficient in the scan. The level value is the coefficient's value. An End-Of-Block (EOB) symbol, typically a level value equal to zero, is used indicate that there are no more non-zero coefficients in the block.

In an alternative scheme, each non-zero coefficient is represented by 3 values (run, level, last). In this representation, the level and run parameters serve the same purpose as explained in the previous paragraph. The last parameter indicates that there are no more non-zero coefficients in the scan. When this representation of the coefficients is used, a separate syntax element is used to indicate that a given block is coded and therefore there is no need for separate EOB symbol.

For the purposes of entropy coding, each (run, level) pair (or (run, level, last) triplet) is typically treated as a single symbol. Thus, VLC codewords are assigned to the different possible (run, level) pairs. A unique codeword is also assigned to the EOB symbol. Commonly, the mapping between the possible (run, level) pairs and the VLC codewords is implemented in the form of a fixed look-up table, known to (e.g. stored in) both the encoder and decoder. The VLC codewords are used to convert the symbols to a binary representation which is transmitted to the decoder and are designed in such a way as to be uniquely decodable. In practical terms this means that no VLC codeword may be the prefix for another codeword.

Table 1 is a look-up table of the type just described, showing an exemplary mapping between specific (run, level) pairs and VLC codewords. In the example presented in Table 1 the EOB symbol is assigned the shortest codeword.

TABLE 1

Mapping between (run, length) pairs and VLC codewords

| Run | Level | VLC index | VLC codeword |
|---|---|---|---|
| — | EOB | 0 | 1 |
| 0 | 1 | 1 | 001 |
| 0 | −1 | 2 | 011 |
| 1 | 1 | 3 | 00001 |
| 1 | −1 | 4 | 00011 |
| 2 | 1 | 5 | 01001 |
| 2 | −1 | 6 | 01011 |
| 0 | 2 | 7 | 0000001 |
| 0 | −2 | 8 | 0000011 |
| 3 | 1 | 9 | 0001001 |
| 3 | −1 | 10 | 0001011 |
| 4 | 1 | 11 | 0100001 |
| 4 | −1 | 12 | 0100011 |
| ... | ... | ... | ... |

Figure 5:
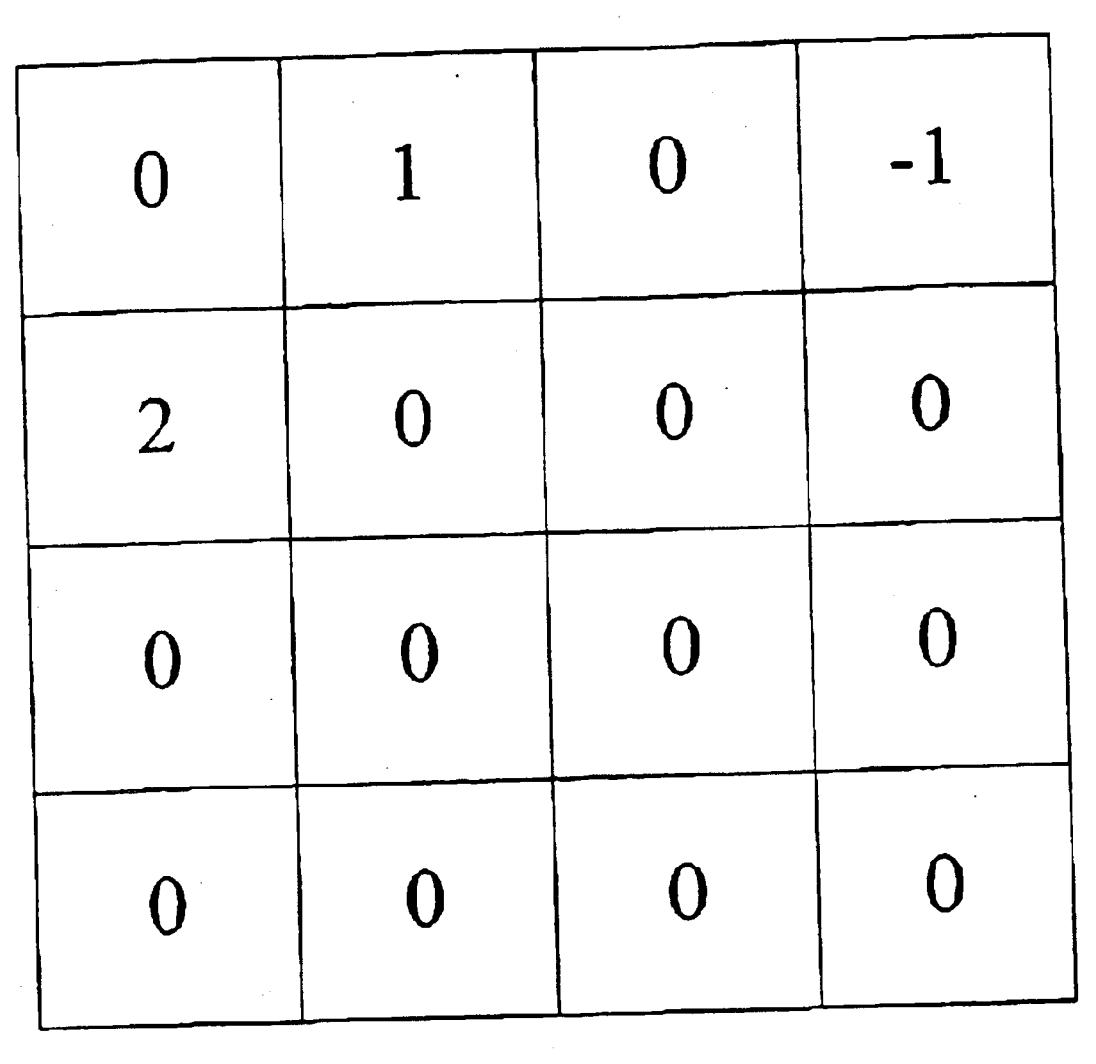

FIG. 5 shows an example of a 4×4 array of quantised transform coefficients, such as that generated in a video encoder for an image block in INTRA-codng mode or a block of prediction error values in INTER-coding mode. After applying the zigzag scanning scheme shown in FIG. 4, the ordered one-dimensional sequence of quantised coefficients thus produced has the following elements:

0, 1, 2, 0, 0, 0, −1, 0, 0, 0, 0, 0, 00, 0, 0

This sequence can further be represented as the following set of (run, level) pairs terminated with an EOB symbol:

(1,1), (0,2), (3,−1), EOB.

Applying the mapping between (run, level) pairs and VLC codewords given in Table 1, the following sequence of bits is generated:

00001|0000001|0001011|1

As mentioned above, this is the binary representation of the quantised transform coefficients transmitted in the bit-stream from the encoder to the decoder. In order to correctly decode the bit-stream, the decoder is aware of the mapping between VLC codewords and the (run, level) pairs. In other words, both encoder and decoder use the same set of VLC codewords and the same assignment of symbols to VLC codewords.

In order to maximise the compression provided by variable length coding, those symbols which occur most frequently in the data to be coded should be assigned the shortest VLC codewords. However, in image coding, the frequency of occurrence (i.e. probability) of different transform coefficients and hence the probability of different (run, level) pairs changes depending on the image content and the type of the encoded image. Thus, if a single set of variable length codewords is used and only a single mapping between the data symbols to be encoded/decoded and the VLCs is provided, in general, optimum coding efficiency cannot be achieved.

One solution to this problem is to transmit the variable length codewords and their assignment to the different data symbols as a part of the bit-stream. This possibility is included in the international still image compression standard ISO/IEC 10918-1 "Digital Compression and Coding of Continuous-Tone Still Images"/ITU-T recommendation T.81 developed by the Joint Photographic Expert Group and commonly referred to as the JPEG image coding standard. If this option is employed, the probabilities of different data symbols, for example the probabilities of different (run, level) pairs, are calculated for each image to be coded. This information is then used to create the VLC codewords and to define the mapping between the data symbols and the codewords. The codewords and the mapping information are, for example, included in the compressed file for a given image and are transmitted in the bit-stream from the encoder to the decoder. This solution allows the codewords and the mappings between the codewords and the data symbols to be constructed in a way that is adaptive to the nature/content of the image to be coded. In this way a level of data compression can be achieved which generally exceeds that which could be attained if fixed codewords and mappings were used. However, this approach has a number of technical disadvantages, which make it unsuitable for use in video applications. More specifically, a significant delay is introduced, as each image, or each part thereof, requires pre-processing before any of the image data can be encoded and transmitted. Furthermore, a large number of bits required to specify information about the variable length codewords and their assignment to the data symbols. Additionally, error resilience is a significant problem. If information relating to the codewords, or the mapping between the codewords and the data symbols, is lost or has residual errors after undergoing error correction at the decoder, the bit-stream comprising the encoded image data cannot be decoded correctly.

In an alternative technique aimed at improving the data compression provided by variable length coding, known as adaptive VLC coding, initial VLC codes and mappings are calculated in both the encoder and the decoder based on a priori symbol probability estimates. In image coding applications these probability estimates may be calculated in advance, for example using a database of so-called 'training' images representative/typical of those to be encoded and transmitted. Subsequently, the symbol probability estimates are updated in the encoder and decoder as further encoded data symbols are transmitted. Using the updated probability estimates the encoder and decoder re-calculate the VLC codewords and their assignments. This re-calculation may be performed very frequently, for example after receiving each new symbol. The main drawbacks of this method are high computational complexity (particularly if the probability estimates are re-calculated very frequently) and poor error resilience. Incorrect decoding of one symbol causes a mismatch between the encoder and decoder symbol counts causing the VLC codes designed in the encoder and decoder to differ from that point onwards. This means that the probability counts should be reset at frequent intervals and this tends to decrease the coding efficiency achieved by using this method.

As previously mentioned, modern video coding systems typically provide more than one method of entropy coding. For example, ITU-T recommendation H.26L, as described in G. Bjontegaard, "H.26L Test Model Long Term Number 8 (TML-8) draft 0", VCEG-N10, June 2001, section 5, provides two alternative methods/modes of entropy coding. The first, default, method is based on variable length coding and the other is a form of arithmetic coding known as context-based binary arithmetic coding (or CABAC for short).

The variable length coding mode of H.26L provides a number of tables specifying VLC codewords and their assignment to data symbols. In the encoder, the particular table selected for use depends on the type of information to be encoded and transmitted. For example, separate VLC lookup tables are provided for the coding of data symbols (e.g. (run, level) pairs) associated with different types of coded image blocks (e.g. INTRA-coded (I) or INTER-coded (P) type blocks), different components of the colour model (luminance or chrominance components) or different values of quantisation parameter (QP). This approach offers a good trade-off between computational complexity and compression efficiency. However, its performance depends on how well the parameters used to switch between the tables characterise the statistical properties of the data symbols.

The context-based binary arithmetic coding mode of H.26L takes advantage of the inherently adaptive nature of arithmetic coding and generally provides improved compression efficiency compared with the default VLC coding mode. However, it has comparatively high computational complexity and its use in error prone environments is problematic. Specifically, it suffers technical shortcomings relating to the loss of synchronisation between encoder and decoder which can arise if transmission errors cause incorrect decoding of part of a codeword. Furthermore, the computational complexity of the CABAC method adopted in the H.26L recommendation is especially high on the decoder side where the time taken for symbol decoding may represent a large fraction of the total decoding time.

Because of the inherent problems of high computational complexity and sensitivity to transmission errors associated with arithmetic coding, variable length coding is still viewed as a powerful and efficient method of entropy coding for use in video coding systems. However, there is still a desire and need to improve the adaptability of VLC coding schemes to the type and statistical properties of the data symbols to be coded so that a high degree of data compression can be achieved consistently. This gives rise to a technical problem concerning the way in which improved adaptability and compression efficiency can be achieved without giving rise to a significant increase in computational complexity or sensitivity to transmission errors.

SUMMARY OF THE INVENTION

The method according to the present invention seeks to address the aforementioned problems relating to improving the adaptability of variable length coding methods to the type and statistical properties of the data symbols to be coded while maintaining low computational complexity and good error resilience.

Expressed in general terms, the invention may be applied in any situation where a set of data symbols to be VLC coded comprises a certain first number of data symbols having a first value and a certain second number of data symbols having values other than the first value and at least one characteristic of the variable length coding applied to the set of data symbols is varied or adapted according to the number of data symbols which have values other than the first value. More specifically, the method according to the invention may be applied when using variable length coding to encode data symbols represented in the form of (run, level) pairs. In this case, the set of data symbols to be encoded/decoded comprises a certain number of non-zero-valued data symbols and certain number of zero-valued data symbols of which the non-zero-valued data symbols are represented in the form of (run, level) pairs. The invention establishes a relationship between the number of non-zero-valued data symbols, the codewords used to represent the (run, level) pairs and the mappings between the (run, level) pairs and the codewords.

Those skilled in the art will appreciate that the method according to the invention can be applied in general to the VLC coding of data symbols which are represented as (run, level) pairs or to any equivalent representation of the set of data symbols to be encoded. In practical implementations of the method according to the invention, multiple VLC look-up tables are provided and a particular look-up table is selected to encode/decode the set of data symbols dependent on the number of data symbols within the set which have values other than the first value (e.g. the number of non-zero-valued data symbols).

Motivation for the method according to the invention arises from the observed statistical properties of the run and level values produced when quantised transform coefficients derived from image data (e.g. in a video encoder) are run-length coded. More specifically, it can be noted that when the number of non-zero-valued quantised transform coefficients is small, (run, level) pairs having a comparatively high run value and small level (magnitude/absolute value) value are more probable. Conversely, when the number of non-zero-valued coefficients is large, (run, level) pairs having small run values and high level values have greater probability. Therefore, a clear difference in the statistical properties of the (run, level) pairs exists in these two situations and it is advantageous in terms of coding efficiency (compression) to use different VLC codewords and/or mappings between data symbols and VLC codewords to take account of this difference.

According to a first aspect of the invention there is provided a method of variable length coding a set of data symbols comprising a certain first number of data symbols having a first value and a certain second number of data symbols having values other than said first value. According to the method at least one characteristic of the variable length coding applied to the data symbols is adapted according to the second number of data symbols which have values other than the first value.

Preferably, the first value is zero, such that the set of data symbols comprises a certain first number of zero-valued data symbols and a certain second number of non-zero-valued data symbols.

Preferably, the method comprises representing each of the first number of non-zero-valued data symbols by a pair of values comprising a first value indicative of the value of the non-zero-valued data symbol and a second value indicative of a number of zero-valued data symbols preceding or following the non-zero-valued data symbol in such a way as to form a set of pairs of first and second values representative of the set of data symbols. Advantageously, this operation is accompanied by performing a mapping operation in which each pair of the set of pairs of first and second values is assigned to a codeword in such a way as to form a set of encoded values representative of the set of data symbols, the codeword being selected from a set of codewords designed to provide a reduction in an amount of information required to represent said set of data symbols when used in the mapping operation. According to the inventive method, the mapping operation is performed by using at least one set of codewords in which the codewords are designed in dependence on the number of non-zero-valued data symbols in the set of data symbols.

Advantageously, the mapping between codewords and data symbols is also dependent on the number of non-zero-valued data symbols in said set of data symbols.

Advantageously, the mapping operation is performed by means of an assignment table which defines the assignment of pairs of first and second values to codewords.

Preferably, the mapping operation is performed by selecting one of a set of selectable assignment tables and assigning each of said pairs of first and second values to a codeword according to a mapping defined by the selected assignment table.

Advantageously an assignment table may also be selected in dependence on another characteristic of the set of data symbols. Advantageously, the other characteristic is a value of a quantisation parameter.

Preferably, an assignment table is selected in dependence upon the number of non-zero-valued data symbols in the set of data symbols.

Advantageously, the set of data symbols is a set of quantised transform coefficient values.

Preferably, the method of variable length coding according to the invention is performed in an encoding device. In an embodiment of the invention, the encoding device is a video encoder. Advantageously, the encoding device is implemented in a mobile telecommunications device.

Advantageously, the method according to the invention also comprises the step of decoding the set of encoded values representative of the set of data symbols.

Preferably the decoding step comprises performing an inverse mapping operation in which each codeword forming said set of encoded values is used to identify a specific one of the set of pairs of first and second values.

Preferably, the inverse mapping operation is performed by means of an assignment table which defines the assignment of pairs of first and second values to codewords.

Even more preferably, the inverse mapping operation is performed by selecting one of a set of selectable assignment tables and identifying a specific one of the set of pairs of first and second values according to the assignment defined by the selected assignment table.

Advantageously a value indicative of the number of non-zero valued data symbols in said set of data symbols is used to select one of the selectable assignment tables used in decoding the set of encoded values.

Alternatively, a value indicative of the number of zero-valued data symbols in the set of data symbols is used to select one of the selectable assignment tables used in decoding the set of encoded values.

Advantageously, the decoding step further comprises reconstructing the set of data symbols from the set of pairs of first and second values.

Preferably, the decoding step is performed in a decoding device. In an embodiment of the invention, the decoding device is a video decoder. Advantageously, the decoding device is implemented in a mobile telecommunications device.

Preferably, the value indicative of said number of non-zero valued data symbols in the set of data symbols is transmitted from the encoding device to the decoding device. Alternatively, the value indicative of the number of zero-valued data symbols in the set of data symbols is transmitted from the encoding device to the decoding device.

According to a second aspect of the invention there is provided an encoder for variable length coding a set of data symbols comprising a certain first number of data symbols having a first value and a certain second number of data symbols having values other than said first value. According to the invention, the encoder is arranged to adapt at least one characteristic of the variable length coding applied to the data symbols according to the second number of data symbols.

According to a third aspect of the invention there is provided a decoder for variable length decoding variable length codewords representing a set of data symbols, the set of data symbols comprising a certain first number of data symbols having a first value and a certain second number of data symbols having values other than said first value. According to the invention, decoder is arranged to adapt at least one characteristic of the variable length decoding applied to the variable length codewords according to an indication of the second number of data symbols in said set of data symbols.

BRIEF DESCRIPTION OF THE DRAWINGS

Embodiments of the invention will now be described by example with reference to the appended drawings, in which:

FIG. 5 shows an example of a two-dimensional array of quantised transform coefficient values;

DETAILED DESCRIPTION OF THE INVENTION

In the detailed description of the invention which follows, an exemplary embodiment of the method according to the invention is presented. The exemplary embodiment relates to the variable length coding of (run, level) pairs representing non-zero-valued transform coefficient produced as a result of block-based transform coding in a video encoder, as well as their subsequent decoding in a corresponding video decoder.

Figure 1:
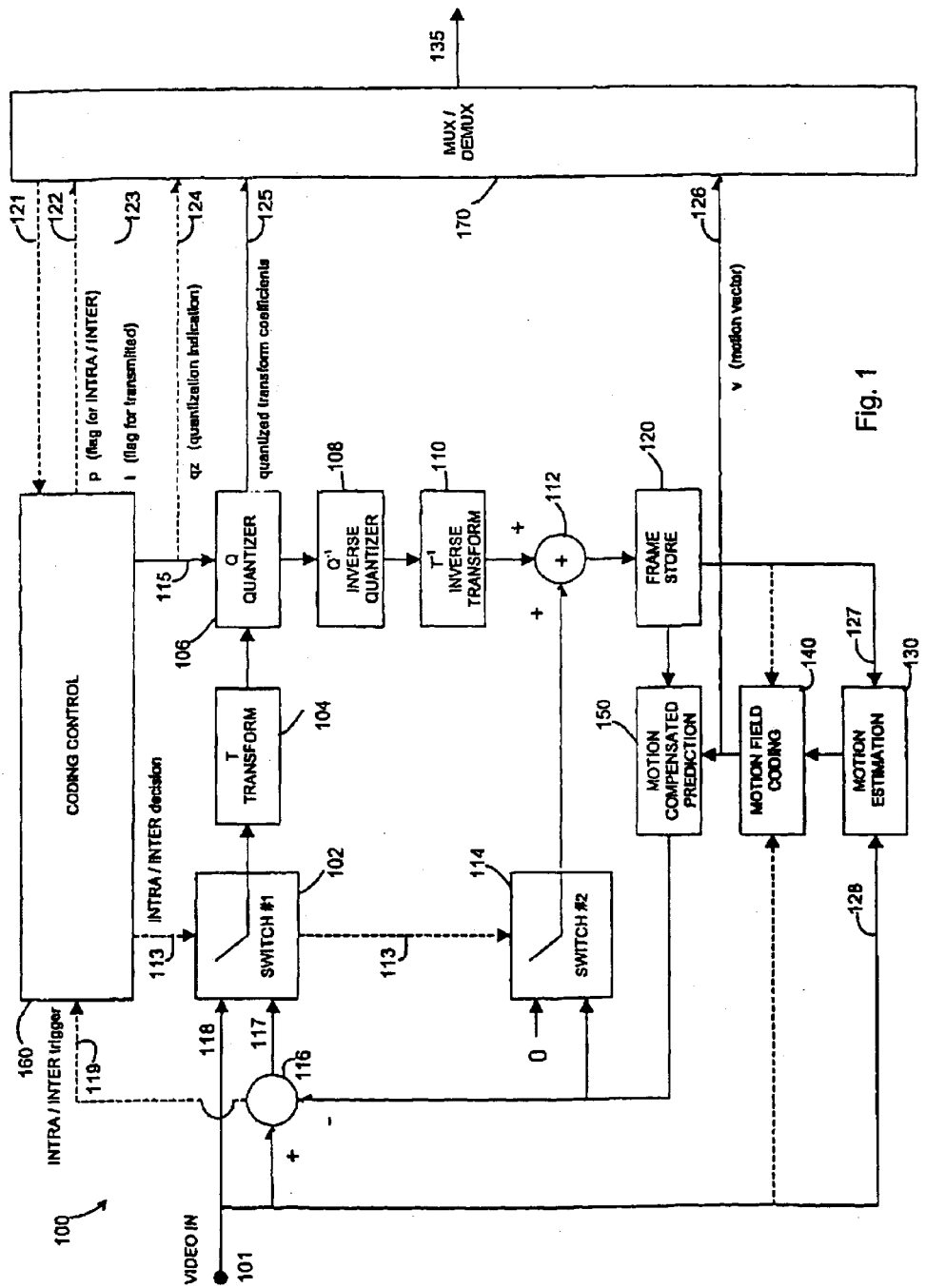
FIG. 1 is a schematic block diagram of a generic video encoder according to prior art.
Figure 6:
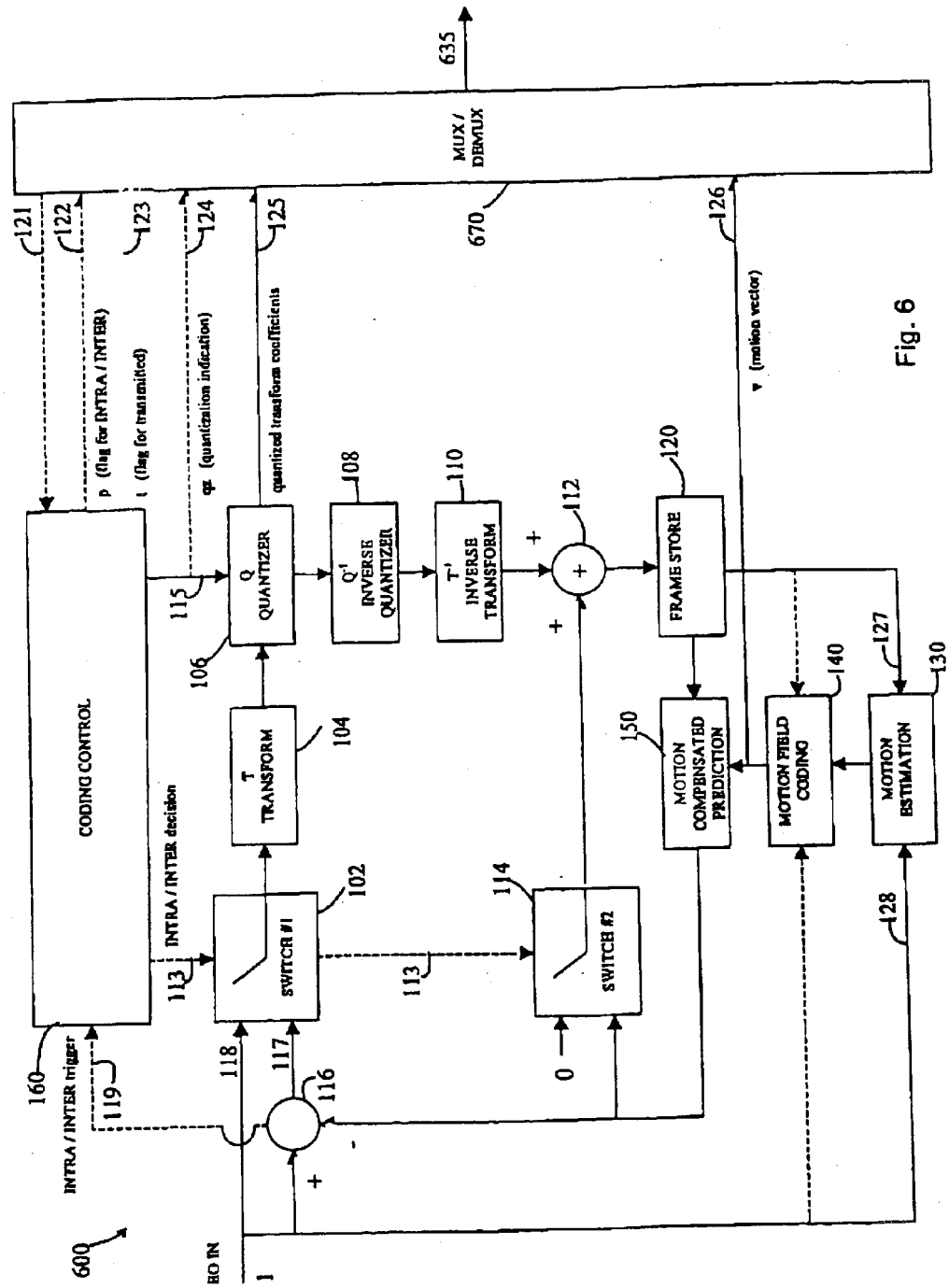
FIG. 6 is a schematic block diagram of a video encoder according to an embodiment of the invention.

FIG. 6 is a schematic block diagram of a video encoder 600 in which the method according to this embodiment of the invention may be applied. The structure of the video encoder shown in FIG. 6 is substantially identical to that of the prior art video encoder shown in FIG. 1, with appropriate modifications to those parts of the encoder which perform variable length coding operations. All parts of the video encoder which implement functions and operate in a manner identical to the previously described prior art video encoder are identified with identical reference numbers. In this description it will be assumed that all variable length coding operations are performed in video multiplex coder 670. However, it should be appreciated that in alternative embodiments of the invention a separate variable length coding unit or units may be provided. It should also be noted that the method according to the invention may be applied to certain of the data symbols produced by the video encoder (e.g. the (run, level) pairs associated with non-zero-valued transform coefficients) and other VLC coding methods may be used to encode other data symbols.

Operation of the video encoder 600 will now be considered in detail. When encoding a frame of digital video, encoder 600 operates in a manner similar to that previously described to generate INTRA-coded and INTER-coded compressed video frames. As explained earlier in the text, in INTRA-coding mode, a Discrete Cosine Transform (DCT) is applied to each block of image data (pixel values) in order to produce a corresponding two-dimensional array of transform coefficient values. The DCT operation is performed in transform block 104 and the coefficients thus produced are subsequently passed to quantiser 106, where they are quantised. In INTER-coding mode, the DCT transform performed in block 104 is applied to blocks of prediction error values. The transform coefficients produced as a result of this operation are also passed to quantiser 106 where they too are quantised. INTER-coded frames may contain INTRA-coded image blocks. In some situations transform coding is not applied to particular image blocks. For example, if INTRA-prediction is used in INTRA-coding mode, some image blocks are predicted in the encoder from one or more previously encoded image block. In this case the encoder provides the decoder with an indication of the previous blocks to be used in the prediction and does not output any transform coefficient data. In INTER-coding mode, the difference between the prediction for a certain block and the image data of the block itself may be so small that it is advantageous in terms of data compression ratio not to transmit any prediction error information.

According to this embodiment, the method according to the invention is applied to those image blocks which undergo transform coding and subsequent transform coefficient quantisation. When video multiplex coder 670 receives a block (two-dimensional array) of quantised transform coefficients, it determines the number of non-zero-valued coefficients in the array. This number is transmitted to the decoder in bit-stream 635. The number may be transmitted as such, or it too may be encoded before transmission using some form of VLC coding.

Figure 4:
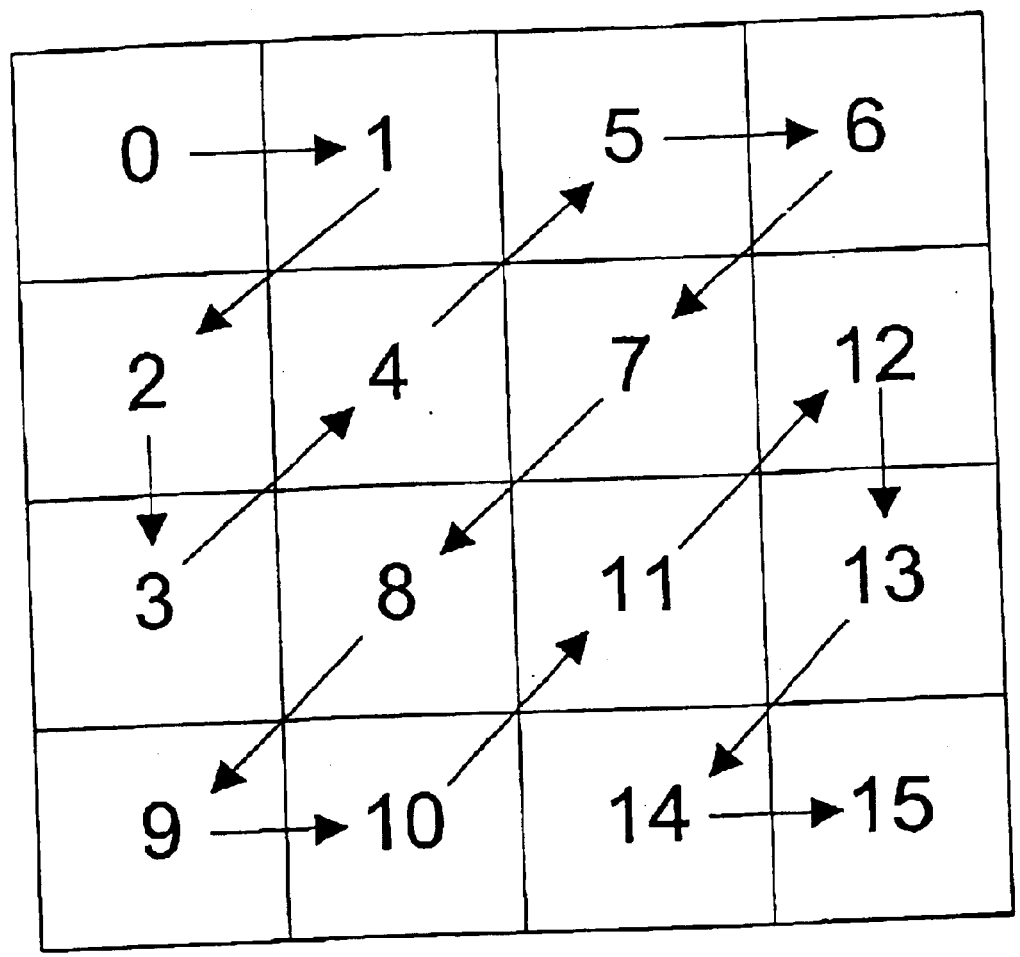
FIG. 4 illustrates an exemplary zigzag scanning order.

The video multiplex coder 670 next represents the non-zero-valued coefficients as (run, level) pairs. This may be done in a manner known from prior art. More specifically, the two-dimensional array of quantised transform coefficients is first scanned using a predefined scanning order, such as that shown in FIG. 4, to produce an ordered one-dimensional array. Each non-zero coefficient value in the ordered one-dimensional array is then represented by a run value and a level value, where the level value represents the value of the coefficient and the run value represents the number of consecutive zero-valued coefficients preceding the non-zero-valued coefficient. Unlike the prior art method of run-length coding previously described, according to the method of the invention, an EOB symbol does not need to be transmitted. The possibility not to transmit an EOB symbol arises because, according to the method of the invention, the number of non-zero-valued quantised transform coefficients is indicated explicitly to the decoder. Thus, when decoding (run, level) pairs for a given image block, the decoder can count the number of decoded pairs. When the number of decoded pairs (corresponding to the number of non-zero-valued coefficients) reaches the number of non-zero-valued coefficients indicated to the decoder, decoding for the block in question can be stopped.

The video multiplex coder 670 then applies variable length coding to the run and level values in such a way that a single VLC codeword is assigned to each (run, level) pair. According to this embodiment of the invention, VLC coding is performed by selecting one of a set of variable length coding (lookup) tables stored in the encoder 600. Each of the coding tables defines a set of variable length codewords, as well as a mapping between the codewords and the possible values of (run, level) pairs which may arise in the quantised transform coefficient data for an image block. According to the invention, the video multiplex coder selects a coding table for use according to the number of non-zero-valued coefficients in the array of quantised transform coefficients for the image block being coded. Using the mappings defined in the selected look-up table, the video multiplex coder assigns a codeword to each (run, level) pair and transmits the codeword to the decoder in the bit-stream 635.

The number of different VLC coding tables may vary in different embodiments of the invention. In one embodiment of the invention, a separate look-up table is provided for each possible number of non-zero-valued quantised transform coefficients. The codewords and the mappings between the (run, level) pairs and the codewords for each one of the tables are designed to provide optimum data compression when applied to a set of (run, level) pairs derived from an array of quantised transform coefficient values having a specified number of non-zero-valued coefficients. Information about the variation of the statistical properties of the (run, level) pairs with respect to the number of non-zero-valued quantised transform coefficients may be obtained empirically, for example, by coding a number of test ('training') images or video sequences in advance. The VLC codewords and the mappings between the codewords can then be designed and stored as one or more look-up table in the encoder.

In a preferred embodiment, for use in coding (run, level) pairs derived from 4×4 image blocks, only two VLC coding tables are provided, one for use when the number of non-zero-valued quantised transform coefficients is smaller than or equal to 8 and one to be used when the number of non-zero-valued quantised transform coefficients is greater than 8. Tables 2 and 3 illustrate the different probability distributions of (run, level) pairs in this embodiment of the invention. The statistics were gathered using a video encoder implemented according to Test Model 8 (TML8) of the current ITU-T recommendation H.26L and relate to INTER-coded image blocks. In the tables, the most probable pair is assigned number 1, the second most probable pair number 2, etc. The first 15 most probable pairs are listed.

TABLE 2

Probabilities of (run, level) pairs when the number of non-zero-valued quantised coefficients is smaller than or equal to 8 (4 × 4 INTER-coded block).

| | | run | | | | | | | | | |
|---|---|---|---|---|---|---|---|---|---|---|---|
| | | 0 | 1 | 2 | 3 | 4 | 5 | 6 | 7 | 8 | 9 |
| level | 1 | 1 | 2 | 3 | 4 | 6 | 7 | 8 | 11 | 12 | 15 |
| amplitude | 2 | 5 | 10 | 13 | | | | | | | |
| | 3 | 9 | | | | | | | | | |
| | 4 | 14 | | | | | | | | | |

TABLE 3

Probabilities of (run, level) pairs when the number of non-zero-valued quantised coefficients is greater than 8 (4 × 4 INTER-coded block).

| | | run | | | |
|---|---|---|---|---|---|
| | | 0 | 1 | 2 | 3 |
| level | 1 | 1 | 3 | 5 | 9 |
| amplitude | 2 | 2 | 7 | 12 | |
| | 3 | 4 | 10 | | |
| | 4 | 6 | 14 | | |
| | 5 | 8 | | | |
| | 6 | 11 | | | |
| | 7 | 13 | | | |
| | 8 | 15 | | | |

In an alternative embodiment of the invention the coding efficiency can be improved by changing type of symbols transmitted. Instead of representing the quantised transform coefficients as (run, level) pairs, they are represented by a (level, last) pairs and a VLC codeword is assigned to each of the (level, last) pairs. The level of a (level, last) pair represents the value of the coefficient, but unlike (run, level) pairs previously described, it can take the value 0. The last parameter is used to indicate that there are no more non-zero-valued coefficients in the block. For example, it can be used as a binary flag, such that if the level value of a particular coefficient is zero and all following coefficient values are zero, last is set equal to 1. This alternative representation of the quantised transform coefficients can provide an improvement in coding efficiency (data compression) particularly for INTRA-coded blocks and in situations where small QP values are used.

In another alternative embodiment of the invention, a fixed set of VLC codewords is used and only the mapping between the codewords and the (run, level) pairs to be encoded changes in dependence upon the number of non-zero-valued coefficients.

In a further alternative embodiment of the invention, the VLC coding table chosen for a particular image block may also be dependent on some other parameter, such as the value of the quantisation parameter (QP) used to qauntise the transform coefficients of an image block or the type of frame or image block (INTRA/INTER). In this case choice of a VLC coding table for a particular array of quantised transform coefficients depends on both the number of non-zero-valued coefficients and the value of the other parameter.

In yet another alternative embodiment of the invention, the number of zero-valued quantised transform coefficient values may be determined and used as the parameter according to which VLC codewords and mappings between the codewords and data symbols are designed and VLC look-up tables are selected.

Figure 2:
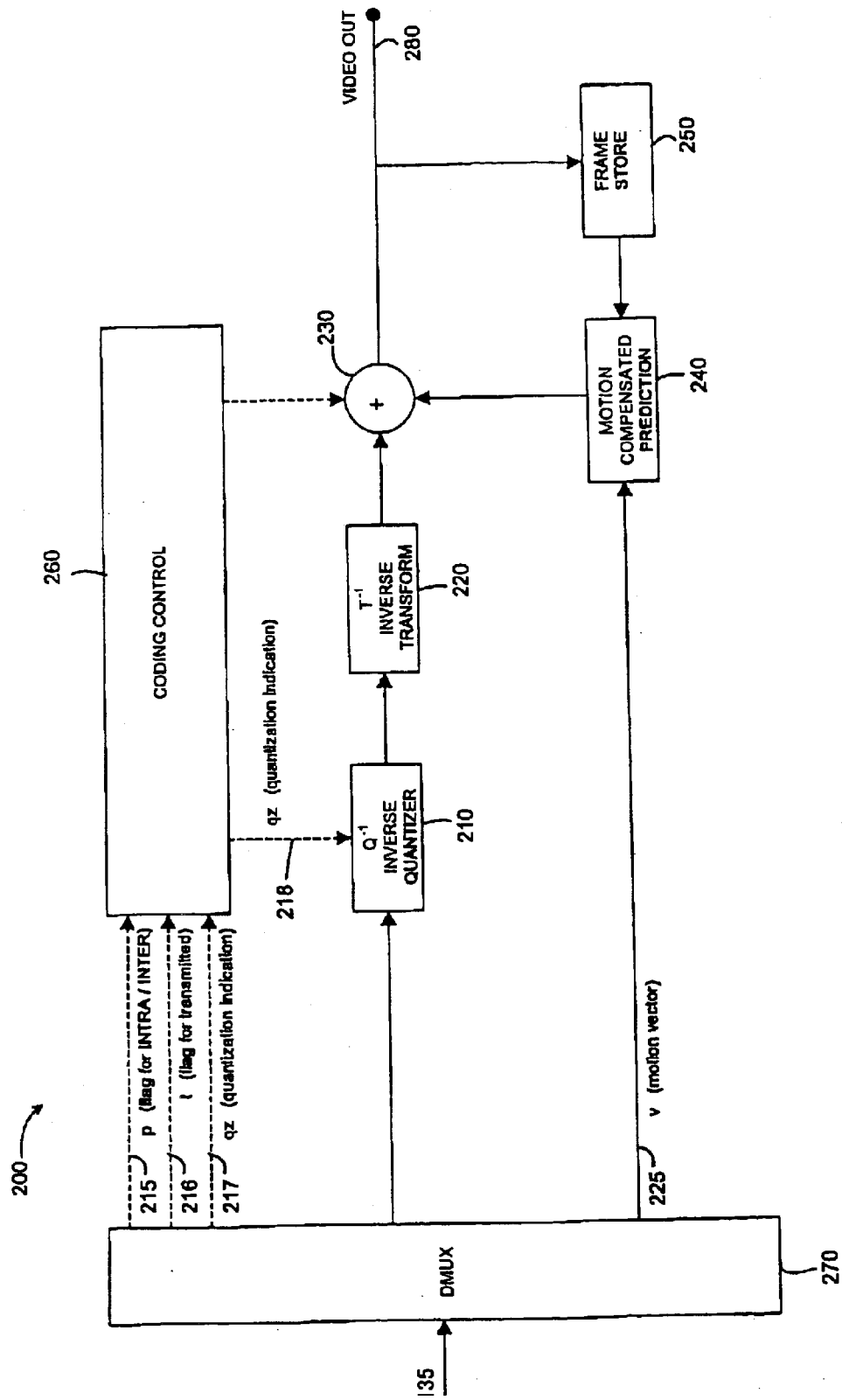
FIG. 2 is a schematic block diagram of a generic video decoder according to prior art and corresponding to the encoder shown in FIG. 1.
Figure 3:
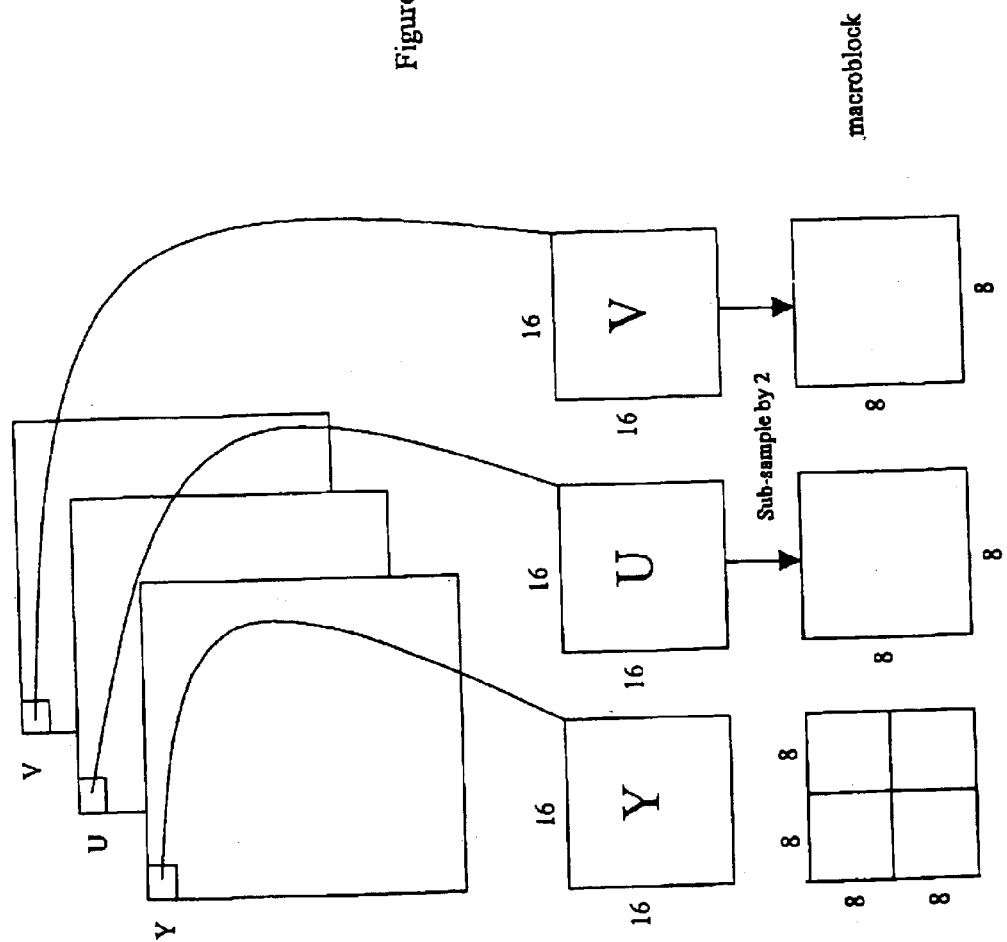
FIG. 3 illustrates the formation of a macroblock according to prior art.
Figure 7:
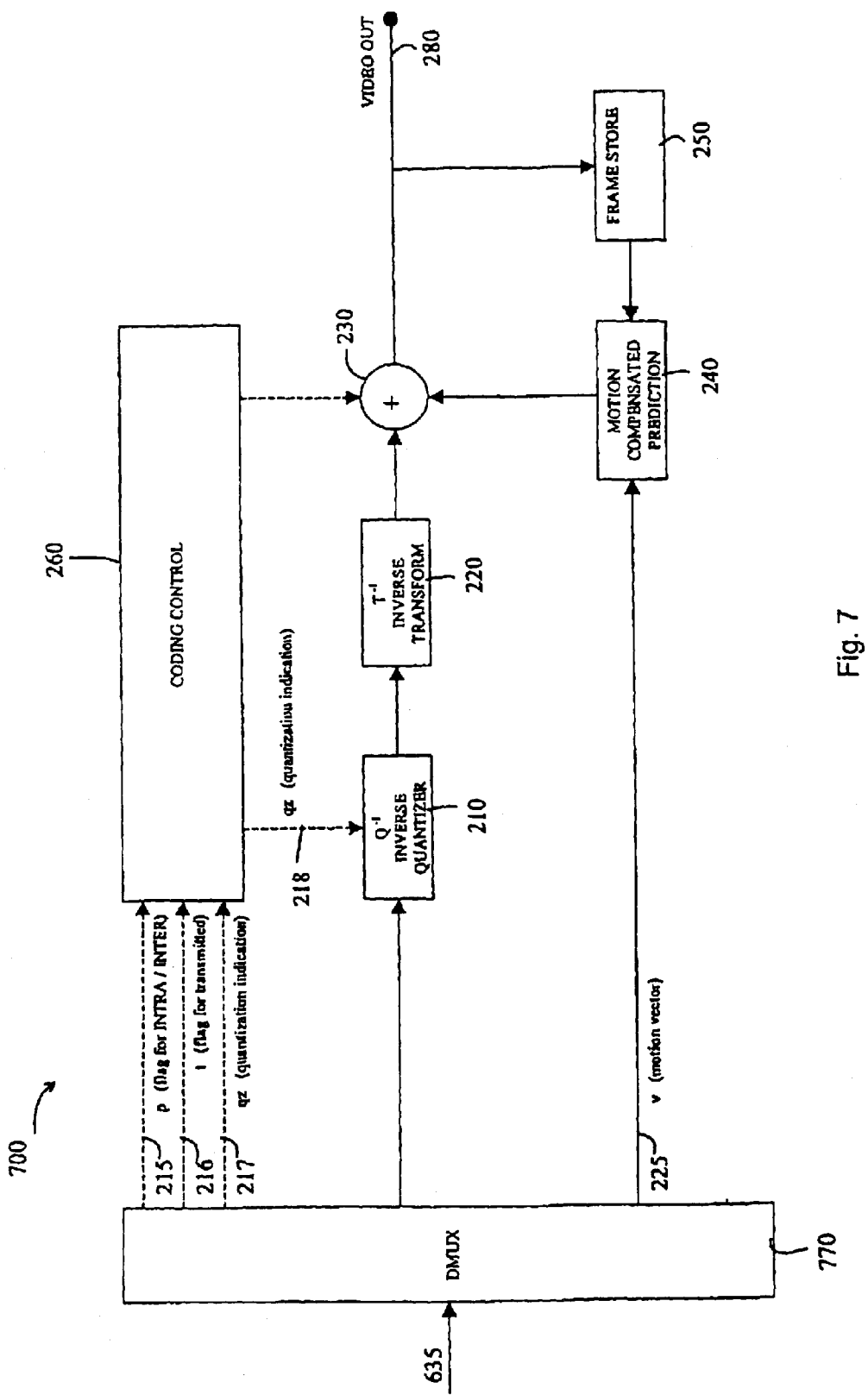
FIG. 7 is a schematic block diagram of a video decoder according to an embodiment of the invention and corresponding to the encoder shown in FIG. 6.

Operation of a video decoder 700 according to an embodiment of the invention will now be described with reference to FIG. 7. The structure of the video decoder illustrated in FIG. 7 is substantially identical to that of the prior art video decoder shown in FIG. 2, with appropriate modifications to those parts of the decoder which perform variable length decoding operations. All parts of the video decoder which implement functions and operate in a manner identical to the previously described prior art video decoder are identified with identical reference numbers. In the description which follows it is assumed that all variable length decoding operations are performed in video multiplex decoder 770. However, it should be appreciated that in alternative embodiments of the invention a separate variable length decoding unit or units may be provided.

Operation of the video decoder will now be described in detail. Here it is assumed that the video decoder of FIG. 7 corresponds to the encoder described in connection with FIG. 6 and is therefore capable of receiving and decoding the bit-stream 635 transmitted by encoder 600. In the decoder, the bit-stream is received and separated into its constituent parts by video multiplex decoder 770. As explained in connection with the earlier description of prior art, the compressed video data extracted from the bit-stream is processed on a macroblock-by-macroblock basis. The compressed video data for an INTRA-coded macroblock comprises variable length codewords representing the VLC coded (run, level) pairs for each block of the macroblock, together with encoded control information (for example, relating to quantisation parameter QP). The compressed video data for an INTER-coded macroblock comprises VLC encoded prediction error information for each block, motion vector information for the macroblock and encoded control information.

The VLC coded (run, level) pairs for each block of an INTRA-coded macroblock and the VLC coded (run, level) pairs for each block of prediction error data associated with an INTER-coded macroblock are decoded in an identical fashion. More specifically, when decoding the VLC coded (run, level) pairs for an INTRA- or INTER-coded image block, video multiplex decoder 770 first determines the number of non-zero-valued quantised transform coefficients in the block. As previously explained, information relating to the number of non-zero-valued quantised transform coefficients is inserted into bit-stream 635 by encoder 600. Decoder 700 extracts this information from the received bit-stream. If the information relating to the number of non-zero-valued quantised transform coefficients is itself VLC coded, video multiplex decoder 770 performs an appropriate variable length decoding operation to recover the information.

Once the number of non-zero-valued quantised transform coefficients has been determined, video multiplex decoder 770 selects a variable length decoding table according to the number of non-zero-valued quantised transform coefficients in the block. The decoding table is selected from a set of look-up tables identical to those used in the encoder. The decoding tables are stored in advance in the decoder and define the mapping between VLC codewords received in bit-stream 635 and the possible values of (run, level) pairs which may arise in the quantised transform coefficient data for an image block. Having selected the table in accordance with the number of non-zero-valued quantised transform coefficients, video multiplex decoder 770 uses the mappings defined in the selected look-up table to recover the run and level values. It then reconstructs the quantised transform coefficient values for the block and passes them to inverse quantiser 210. The remainder of the video decoding procedure whereby reconstructed pixel values are formed for each image block proceeds as described in connection with prior art video decoder 200.

It should be appreciated that the method according to the invention provides significant advantages compared with the prior art methods of VLC coding previously described. In particular, it provides a method of variable length decoding which is adaptive to the statistical characteristics of the data symbols to be encoded/decoded, while maintaining comparatively low computational complexity and high resilience to transmission errors. The adaptability of the method stems from the use of different variable length codewords and/or mappings for image blocks which have different numbers of non-zero-valued quantised transform coefficients. Computational complexity is kept low by providing the different codewords and/or mappings as look-up tables in the encoder and decoder. This also helps reduce susceptibility to data transmission errors, as the particular look-up table to be used for a given image block is signalled to the decoder by means of a value indicative of the number of non-zero-valued transform coefficients in the block.

Figure 8:
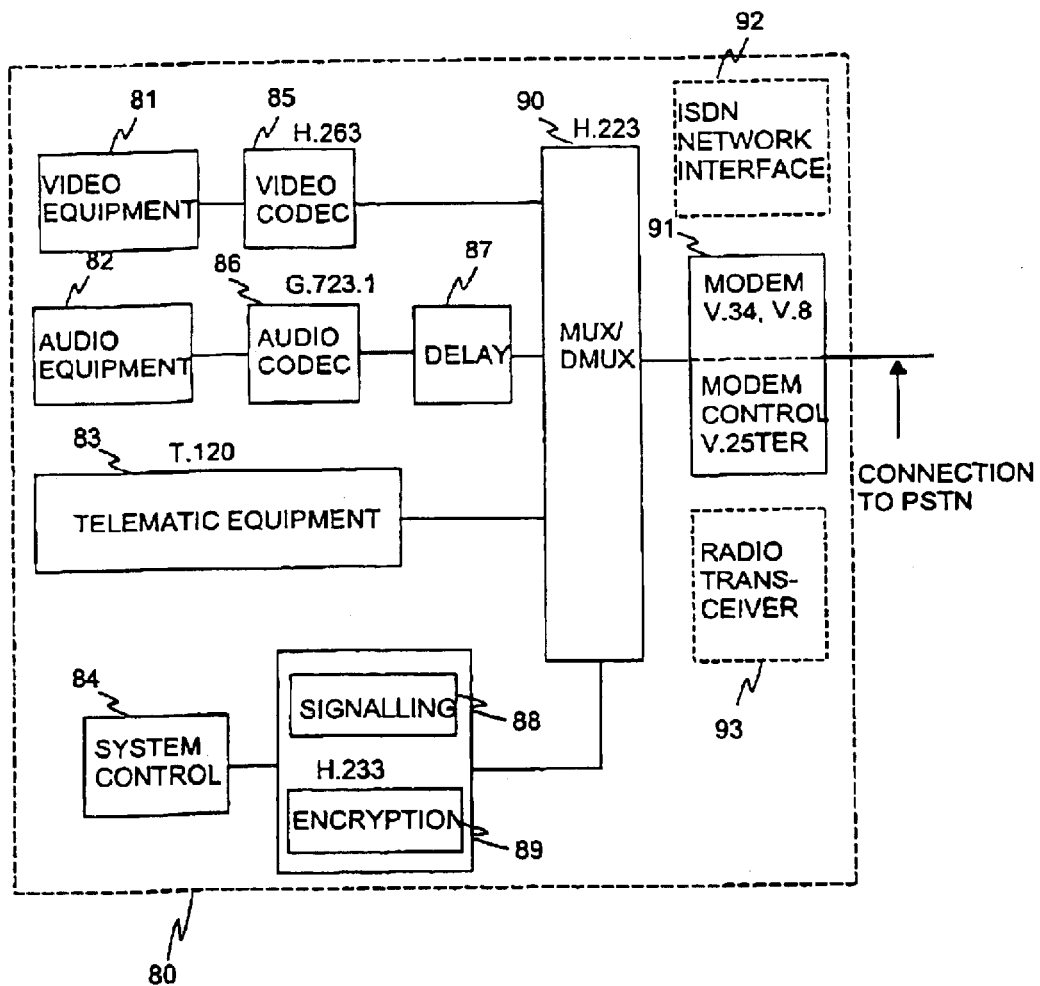
FIG. 8 is a schematic block diagram of a multimedia communications terminal in which the method according to the invention may be implemented.

FIG. 8 presents a terminal device comprising video encoding and decoding equipment which may be adapted to operate in accordance with the present invention. More precisely, the figure illustrates a multimedia terminal 80 implemented according to ITU-T recommendation H.324. The terminal can be regarded as a multimedia transceiver device. It includes elements that capture, encode and multiplex multimedia data streams for transmission via a communications network, as well as elements that receive, de-multiplex, decode and display received multimedia content. ITU-T recommendation H.324 defines the overall operation of the terminal and refers to other recommendations that govern the operation of its various constituent parts. This kind of multimedia terminal can be used in real-time applications such as conversational videotelephony, or non real-time applications such as the retrieval/streaming of video clips, for example from a multimedia content server in the Internet.

In the context of the present invention, it should be appreciated that the H.324 terminal shown in FIG. 8 is only one of a number of alternative multimedia terminal implementations suited to application of the inventive method. It should also be noted that a number of alternatives exist relating to the location and implementation of the terminal equipment. As illustrated in FIG. 8, the multimedia terminal may be located in communications equipment connected to a fixed line telephone network such as an analogue PSTN (Public Switched Telephone Network). In this case the multimedia terminal is equipped with a modem 91, compliant with ITU-T recommendations V.8, V.34 and optionally V.8bis. Alternatively, the multimedia terminal may be connected to an external modem. The modem enables conversion of the multiplexed digital data and control signals produced by the multimedia terminal into an analogue form suitable for transmission over the PSTN. It further enables the multimedia terminal to receive data and control signals in analogue form from the PSTN and to convert them into a digital data stream that can be demultiplexed and processed in an appropriate manner by the terminal.

An H.324 multimedia terminal may also be implemented in such a way that it can be connected directly to a digital fixed line network, such as an ISDN (Integrated Services Digital Network). In this case the modem 91 is replaced with an ISDN user-network interface. In FIG. 8, this ISDN user-network interface is represented by alternative block 92.

H.324 multimedia terminals may also be adapted for use in mobile communication applications. If used with a wireless communication link, the modem 91 can be replaced with any appropriate wireless interface, as represented by alternative block 93 in FIG. 8. For example, an H.324/M multimedia terminal can include a radio transceiver enabling connection to the current $2^{nd}$ generation GSM mobile telephone network, or the proposed $3^{rd}$ generation UMTS (Universal Mobile Telephone System).

It should be noted that in multimedia terminals designed for two-way communication, that is for transmission and reception of video data, it is advantageous to provide both a video encoder and video decoder implemented according to the present invention. Such an encoder and decoder pair is often implemented as a single combined functional unit, referred to as a 'codec'.

A typical H.324 multimedia terminal will now be described in further detail with reference to FIG. 8.

The multimedia terminal 80 includes a variety of elements referred to as 'terminal equipment'. This includes video, audio and telematic devices, denoted generically by reference numbers 81, 82 and 83, respectively. The video equipment 81 may include, for example, a video camera for capturing video images, a monitor for displaying received video content and optional video processing equipment. The audio equipment 82 typically includes a microphone, for example for capturing spoken messages, and a loudspeaker for reproducing received audio content. The audio equipment may also include additional audio processing units. The telematic equipment 83, may include a data terminal, keyboard, electronic whiteboard or a still image transceiver, such as a fax unit.

The video equipment 81 is coupled to a video codec 85. The video codec 85 comprises a video encoder and a corresponding video decoder both implemented according to the invention. Such an encoder and a decoder will be described in the following. The video codec 85 is responsible for encoding captured video data in an appropriate form for further transmission over a communications link and decoding compressed video content received from the communications network. In the example illustrated in FIG. 8, the video codec is implemented according to ITU-T recommendation H.26L, with appropriate modifications to implement the adaptive variable length coding method according to the invention in both the encoder and the decoder of the video codec.

The terminal's audio equipment is coupled to an audio codec, denoted in FIG. 8 by reference number 88. Like the video codec, the audio codec comprises an encoder/decoder pair. It converts audio data captured by the terminal's audio equipment into a form suitable for transmission over the communications link and transforms encoded audio data received from the network back into a form suitable for reproduction, for example on the terminal's loudspeaker. The output of the audio codec is passed to a delay block 87. This compensates for the delays introduced by the video coding process and thus ensures synchronisation of audio and video content.

The system control block 84 of the multimedia terminal controls end-to-network signalling using an appropriate control protocol (signalling block 88) to establish a common mode of operation between a transmitting and a receiving terminal. The signalling block 88 exchanges information about the encoding and decoding capabilities of the transmitting and receiving terminals and can be used to enable the various coding modes of the video encoder. The system control block 84 also controls the use of data encryption. Information regarding the type of encryption to be used in data transmission is passed from encryption block 89 to the multiplexer/demultiplexer (MUX/DMUX unit) 90.

During data transmission from the multimedia terminal, the MUX/DMUX unit 90 combines encoded and synchronised video and audio streams with data input from the telematic equipment 83 and possible control data, to form a single bit-stream. Information concerning the type of data encryption (if any) to be applied to the bit-stream, provided by encryption block 89, is used to select an encryption mode. Correspondingly, when a multiplexed and possibly encrypted multimedia bit-stream is being received, MUX/DMUX unit 90 is responsible for decrypting the bit-stream, dividing it into its constituent multimedia components and passing those components to the appropriate codec(s) and/or terminal equipment for decoding and reproduction.

It should be noted that the functional elements of the multimedia terminal, video encoder, decoder and video codec according to the invention can be implemented as software or dedicated hardware, or a combination of the two. The variable length coding and decoding methods according to the invention are particularly suited for implementation in the form of a computer program comprising machine-readable instructions for performing the functional steps of the invention. As such, the variable length encoder and decoder according to the invention may be implemented as software code stored on a storage medium and executed in a computer, such as a personal desktop computer.

If the multimedia terminal 80 is a mobile terminal, that is, if it is equipped with a radio transceiver 93, it will be understood by those skilled in the art that it may also comprise additional elements. In one embodiment it comprises a user interface having a display and a keyboard, which enables operation of the multimedia terminal 80 by a user, a central processing unit, such as a microprocessor, which controls the blocks responsible for different functions of the multimedia terminal, a random access memory RAM, a read only memory ROM, and a digital camera. The microprocessor's operating instructions, that is program code corresponding to the basic functions of the multimedia terminal 80, is stored in the read-only memory ROM and can be executed as required by the microprocessor, for example under control of the user. In accordance with the program code, the microprocessor uses the radio transceiver 93 to form a connection with a mobile communication network, enabling the multimedia terminal 80 to transmit information to and receive information from the mobile communication network over a radio path.

The microprocessor monitors the state of the user interface and controls the digital camera. In response to a user command, the microprocessor instructs the camera to record digital images into the RAM. Once an image is captured, or alternatively during the capturing process, the microprocessor segments the image into image segments (for example macroblocks) and uses the encoder to perform motion compensated encoding for the segments in order to generate a compressed image sequence as explained in the foregoing description. A user may command the multimedia terminal 80 to display the captured images on its display or to send the compressed image sequence using the radio transceiver 93 to another multimedia terminal, a video telephone connected to a fixed line network (PSTN) or some other telecommunications device. In a preferred embodiment, transmission of image data is started as soon as the first segment is encoded so that the recipient can start a corresponding decoding process with a minimum delay.

What is claimed is:

1. A method of variable length coding a set of data symbols comprising a certain first number of data symbols having a first value and a certain second number of data symbols having values other than said first value, wherein at least one characteristic of the variable length coding applied to the data symbols is adapted according to said certain second number of data symbols which have values other than the first value.

2. A method according to claim 1, wherein said first value is zero, such that said set of data symbols comprises a certain first number of zero-valued data symbols and a certain second number of non-zero-valued data symbols.

3. A method according to claim 2, comprising the steps of:
representing each of said certain first number of non-zero-valued data symbols by a pair of values comprising a first value indicative of the value of said non-zero-valued data symbol and a second value indicative of a number of zero-valued data symbols preceding or following said non-zero-valued data symbol to form a set of pairs of first and second values representative of the set of data symbols;
performing a mapping operation in which each pair of said set of pairs of first and second values is assigned to a codeword thereby forming a set of encoded values representative of the set of data symbols, the codeword being selected from a set of codewords, said set of codewords having been designed to provide a reduction in an amount of information required to represent said set of data symbols when used in said mapping operation.

4. A method according to claim 3, wherein said mapping operation is dependent on said number of non-zero-valued data symbols in said set of data symbols.

5. A method according to claim 3, wherein said mapping operation is performed by means of an assignment table which defines the assignment of pairs of first and second values to codewords.

6. A method according to claim 3, wherein said mapping operation is performed by selecting one of a set of selectable assignment tables, wherein each table of said set of selectable assignment tables defines an assignment of pairs of first and second values to codewords and assigning each of said pairs of first and second values to a codeword according to the assignment defined by said selected assignment table.

7. A method according to claim 6, wherein an assignment table is selected in dependence on a characteristic of the set of data symbols.

8. A method according to claim 6, wherein an assignment table is selected in dependence on the number of non-zero-valued data symbols in said set of data symbols.

9. A method according to claim 1, wherein said set of data symbols is a set of quantised transform coefficient values.

10. A method according to claim 9, wherein said first value of said pair of first and second values represents a value of non-zero-valued quantised transform coefficient and said second value of said pair of first and second values represents a number of zero-valued quantised transform coefficients preceding said non-zero-valued quantised transform coefficient.

11. A method according to claim 1, performed in an encoding device.

12. A method according to claim 11, wherein the encoding device is a video encoder.

13. A method according to claim 1, further comprising the step of decoding said set of encoded values representative of the set of data symbols.

14. A method according to claim 13, wherein said step of decoding said set of encoded values comprises performing an inverse mapping operation in which each codeword forming said set of encoded values is used to identify a specific one of said set of pairs of first and second values.

15. A method according to claim 14, wherein said inverse mapping operation is dependent on said number of non-zero-valued data symbols in said set of data symbols.

16. A method according to claim 14, wherein said inverse mapping operation is performed by means of an assignment table which defines the assignment of pairs of first and second values to codewords.

17. A method according to claim 14, wherein said inverse mapping operation is performed by selecting one of a set of selectable assignment tables, wherein each table of said set of selectable assignment tables defines an assignment of pairs of first and second values to codewords and identifying a specific one of said set of pairs of first and second values according to the assignment defined by said selected assignment table.

18. A method according to claim 17, wherein a value indicative of said number of non-zero values in said set of data symbols is used in said step of decoding said set of encoded values to select one of said selectable assignment tables.

19. A method according to claim 17, wherein a value indicative of said number of zero-valued data symbols in said set of data symbols is used in said step of decoding said set of encoded values to select on of said selectable assignment tables.

20. A method according to claim 13, wherein said step of decoding said set of encoded values further comprises reconstructing said set of data symbols from said set of pairs of first and second values.

21. A method according to claim 13, wherein said step of decoding said set of encoded values is performed in a decoding device.

22. A method according to claim 21, wherein the decoding device is a video decoder.

23. A method according to claim 21, wherein said value indicative of said number of non-zero-valued data symbols in said set of data symbols is transmitted from said encoding device to said decoding device.

24. A method according to claim 21, wherein said value indicative of said number of zero-valued data symbols in said set of data symbols is transmitted from said encoding device to said decoding device.

25. An encoder for variable length coding a set of data symbols comprising a certain first number of data symbols having a first value and a certain second number of data symbols having values other than said first value, wherein the encoder is arranged to adapt at least one characteristic of the variable length coding applied to the data symbols according to said certain second number of data symbols which have values other than the first value.

26. An encoder according to claim 25, wherein said first value is zero, such that said set of data symbols comprises a certain first number of zero-valued data symbols and a certain second number of non-zero-valued data symbols and that the encoder is arranged to adapt at least one characteristic of the variable length coding applied to the data symbols according to the number of non-zero-valued data symbols in said set of data symbols.

27. An encoder according to claim 26, comprising:
means for representing each of said certain first number of non-zero-valued data symbols by a pair of values comprising a first value indicative of the value of said non-zero-valued data symbol and a second value indicative of a number of zero-valued data symbols preceding or following said non-zero-valued data symbol to form a set of pairs of first and second values representative of the set of data symbols;

means for performing a mapping operation in which each pair of said set of pairs of first and second values is assigned to a codeword thereby forming a set of encoded values representative of the set of data symbols, the codeword being selected from a set of codewords, said set of codewords having been designed to provide a reduction in an amount of information required to represent said set of data symbols when used in said mapping operation.

28. An encoder according to claim 27, wherein said mapping operation is arranged to be dependent on said number of non-zero-valued data symbols in said set of data symbols.

29. An encoder according to claim 27, wherein said mapping operation is arranged to be performed by means of an assignment table which defines the assignment of pairs of first and second values to codewords.

30. A method according to claim 27, wherein said mapping operation is arranged to be performed by selecting one of a set of selectable assignment tables, wherein each table of said set of selectable assignment tables defines an assignment of pairs of first and second values to codewords and assigning each of said pairs of first and second values to a codeword according to the assignment defined by said selected assignment table.

31. An encoder according to claim 30, wherein an assignment table is arranged to be selected in dependence on a characteristic of the set of data symbols.

32. An encoder according to claim 30, wherein an assignment table is arranged to selected in dependence on the number of non-zero-valued data symbols in said set of data symbols.

33. An encoder according to claim 25, provided in a video encoder.

34. An encoder according to claim 25, implemented as machine executable code stored on a computer readable storage medium.

35. A decoder for variable length decoding variable length codewords representing a set of data symbols, said set of data symbols comprising a certain first number of data symbols having a first value and a certain second number of data symbols having values other than said first value, wherein the decoder is arranged to adapt at least one characteristic of the variable length decoding applied to the variable length codewords according to an indication of the second number of data symbols in said set of data symbols.

36. A decoder according to claim 35, arranged to decode said variable length codewords by performing an inverse mapping operation in which each of said variable length codewords is used to identify a specific one of said set of pairs of first and second values.

37. A decoder according to claim 36, wherein said first value is zero, such that said set of data symbols comprises a certain first number of zero-valued data symbols and a certain second number of non-zero-valued data symbols and said inverse mapping operation is arranged to be dependent on said number of non-zero-valued data symbols in said set of data symbols.

38. A decoder according to claim 36, wherein said inverse mapping operation is arranged to be performed by means of an assignment table which defines the assignment of pairs of first and second values to codewords.

39. A decoder according to claim 36, wherein said inverse mapping operation is arranged to be performed by selecting one of a set of selectable assignment tables, wherein each table of said set of selectable assignment tables defines an assignment of pairs of first and second values to codewords and identifying a specific one of said set of pairs of first and second values according to the assignment defined by said selected assignment table.

40. A decoder according to claim 39, arranged to use a value indicative of said number of non-zero-valued data symbols in said set of data symbols to select one of said selectable assignment tables.

41. A decoder according to claim 39, arranged to use a value indicative of said number of zero-valued data symbols in said set of data symbols to select one of said selectable assignment tables.

42. A decoder according to claim 35, provided in a video decoder.

43. A decoder according to claim 35, implemented as machine executable code stored on a computer readable storage medium.

* * * * *